United States Patent
Bajaj et al.

(10) Patent No.: US 11,453,097 B2
(45) Date of Patent: Sep. 27, 2022

(54) CHEMICAL MECHANICAL POLISHING APPARATUS AND METHODS

(71) Applicant: Applied Materials, Inc., Santa Clara, CA (US)

(72) Inventors: Rajeev Bajaj, Fremont, CA (US); Thomas H. Osterheld, Mountain View, CA (US); Hung Chen, Sunnyvale, CA (US); Terrance Y. Lee, Oakland, CA (US)

(73) Assignee: Applied Materials, Inc., Santa Clara, CA (US)

( * ) Notice: Subject to any disclaimer, the term of this patent is extended or adjusted under 35 U.S.C. 154(b) by 89 days.

(21) Appl. No.: 16/691,581

(22) Filed: Nov. 21, 2019

(65) Prior Publication Data

US 2020/0086452 A1 Mar. 19, 2020

Related U.S. Application Data

(60) Continuation of application No. 15/635,770, filed on Jun. 28, 2017, now Pat. No. 10,500,694, which is a
(Continued)

(51) Int. Cl.
*B24B 37/04* (2012.01)
*B24B 57/02* (2006.01)
(Continued)

(52) U.S. Cl.
CPC ............ *B24B 37/044* (2013.01); *B24B 37/11* (2013.01); *B24B 37/30* (2013.01); *B24B 57/02* (2013.01);
(Continued)

(58) Field of Classification Search
None
See application file for complete search history.

(56) References Cited

U.S. PATENT DOCUMENTS

| | | | |
|---|---|---|---|
| 5,329,734 | A | 7/1994 | Yu |
| 5,540,810 | A | 7/1996 | Sandhu et al. |

(Continued)

FOREIGN PATENT DOCUMENTS

| | | | |
|---|---|---|---|
| CN | 1458671 | A | 11/2003 |
| CN | 1495863 | A | 5/2004 |

(Continued)

OTHER PUBLICATIONS

Chinese Search Report of Chinese Application No. 201380070166.4, dated Jan. 13, 2017.
(Continued)

*Primary Examiner* — Sylvia Macarthur
(74) *Attorney, Agent, or Firm* — Fish & Richardson P.C.

(57) ABSTRACT

A substrate polishing apparatus is disclosed that includes a polishing platform having two or more zones, each zone adapted to receive a different slurry component. A substrate polishing system is provided having a holder to hold a substrate, a polishing platform having a polishing pad, and a distribution system adapted to dispense, in a timed sequence, at least two different slurry components selected from a group consisting of an oxidation slurry component, a material removal slurry component, and a corrosion inhibiting slurry component. Polishing methods and systems adapted to polish substrates are provided, as are numerous other aspects.

19 Claims, 8 Drawing Sheets

Related U.S. Application Data division of application No. 14/143,276, filed on Dec. 30, 2013, now abandoned.

(60) Provisional application No. 61/751,688, filed on Jan. 11, 2013.

(51) Int. Cl.
  *H01L 21/67* (2006.01)
  *H01L 21/321* (2006.01)
  *H01L 21/306* (2006.01)
  *H01L 21/304* (2006.01)
  *B24B 37/11* (2012.01)
  *B24B 37/30* (2012.01)

(52) U.S. Cl.
  CPC ...... *H01L 21/304* (2013.01); *H01L 21/30625* (2013.01); *H01L 21/3212* (2013.01); *H01L 21/67075* (2013.01); *H01L 21/67092* (2013.01)

(56) References Cited

U.S. PATENT DOCUMENTS

| | | | |
|---|---|---|---|
| 5,643,406 A | 7/1997 | Shimomura et al. | |
| 5,679,063 A | 10/1997 | Kimura | |
| 5,816,900 A | 10/1998 | Nagahara et al. | |
| 5,868,608 A | 2/1999 | Allman et al. | |
| 5,899,745 A | 5/1999 | Kim et al. | |
| 5,997,392 A | 12/1999 | Chamberlin et al. | |
| 6,012,967 A | 1/2000 | Satake et al. | |
| 6,048,256 A | 4/2000 | Obeng et al. | |
| 6,139,406 A | 10/2000 | Kennedy et al. | |
| 6,165,904 A | 12/2000 | Kim | |
| 6,213,852 B1 | 4/2001 | Fujii et al. | |
| 6,248,006 B1* | 6/2001 | Mukhopadhyay | B24B 37/20 451/285 |
| 6,273,806 B1 | 8/2001 | Bennett et al. | |
| 6,280,299 B1 | 8/2001 | Kennedy et al. | |
| 6,283,840 B1 | 9/2001 | Huey | |
| 6,284,092 B1 | 9/2001 | Manfredi | |
| 6,338,669 B1 | 1/2002 | Togawa et al. | |
| 6,348,124 B1* | 2/2002 | Garbett | G05D 11/132 156/345.12 |
| 6,395,194 B1 | 5/2002 | Russell et al. | |
| 6,398,627 B1 | 6/2002 | Chiou et al. | |
| 6,429,131 B2 | 8/2002 | Lin et al. | |
| 6,514,863 B1 | 2/2003 | He | |
| 6,726,534 B1 | 4/2004 | Bogush et al. | |
| 6,858,436 B2 | 2/2005 | Zenhausern et al. | |
| 6,872,128 B1 | 3/2005 | Pham et al. | |
| 6,875,086 B2 | 4/2005 | Golzarian et al. | |
| 6,926,587 B2 | 8/2005 | Takeuchi | |
| 6,929,533 B2 | 8/2005 | Chang | |
| 6,945,854 B2 | 9/2005 | Kurashima et al. | |
| 6,984,166 B2 | 1/2006 | Maury et al. | |
| 7,052,374 B1 | 5/2006 | Lu et al. | |
| 7,459,057 B2 | 12/2008 | Zuniga et al. | |
| 7,559,824 B2 | 7/2009 | Park et al. | |
| 7,883,397 B2 | 2/2011 | Zuniga et al. | |
| 7,980,922 B2 | 7/2011 | Kiesel et al. | |
| 8,088,299 B2 | 1/2012 | Chen et al. | |
| 8,128,461 B1 | 3/2012 | O'Moore et al. | |
| 8,277,286 B2 | 10/2012 | Hung et al. | |
| 8,298,047 B2 | 10/2012 | Zuniga et al. | |
| 8,414,357 B2 | 4/2013 | Wang et al. | |
| 2001/0004538 A1 | 6/2001 | Shijian et al. | |
| 2002/0173232 A1 | 11/2002 | Laursen | |
| 2003/0027505 A1 | 2/2003 | Withers et al. | |
| 2003/0068888 A1 | 4/2003 | Kodera et al. | |
| 2003/0148712 A1 | 8/2003 | Lim et al. | |
| 2003/0168169 A1 | 9/2003 | Ishikawa et al. | |
| 2003/0199229 A1 | 10/2003 | Vereen et al. | |
| 2004/0033759 A1 | 2/2004 | Schultz et al. | |
| 2004/0132388 A1 | 7/2004 | Kulm et al. | |
| 2004/0219867 A1 | 11/2004 | Gotkis et al. | |
| 2005/0026549 A1* | 2/2005 | Maury | B24B 57/02 451/8 |
| 2005/0079801 A1 | 4/2005 | Chang et al. | |
| 2005/0113001 A1* | 5/2005 | Kurashima | B24B 57/02 451/41 |
| 2005/0164603 A1 | 7/2005 | House et al. | |
| 2005/0164613 A1 | 7/2005 | Seike et al. | |
| 2005/0186891 A1* | 8/2005 | Benner | B24B 57/02 257/E21.304 |
| 2006/0021974 A1 | 2/2006 | Liu et al. | |
| 2006/0025049 A1 | 2/2006 | Sun et al. | |
| 2006/0151110 A1 | 7/2006 | Laursen et al. | |
| 2006/0191871 A1* | 8/2006 | Chen | C23F 3/04 216/89 |
| 2007/0060028 A1 | 3/2007 | Chen et al. | |
| 2007/0233306 A1 | 10/2007 | Takada | |
| 2009/0163114 A1 | 6/2009 | Carpio | |
| 2010/0112917 A1 | 5/2010 | Leighton et al. | |
| 2010/0151771 A1 | 6/2010 | Nabeya | |
| 2010/0216373 A1 | 8/2010 | Borucki et al. | |
| 2012/0064803 A1 | 3/2012 | Kitamura et al. | |
| 2012/0190199 A1 | 7/2012 | Reiss et al. | |
| 2013/0023186 A1 | 1/2013 | Motoshima et al. | |
| 2014/0199840 A1 | 7/2014 | Bajaj et al. | |
| 2014/0199842 A1 | 7/2014 | Hardikar et al. | |
| 2014/0312266 A1 | 10/2014 | Park et al. | |
| 2014/0315381 A1 | 10/2014 | Wang et al. | |
| 2015/0021498 A1 | 1/2015 | Hsu et al. | |
| 2016/0027668 A1 | 1/2016 | Osterheld et al. | |
| 2017/0120416 A1 | 5/2017 | Chockalingam et al. | |
| 2017/0297163 A1 | 10/2017 | Bajaj et al. | |
| 2017/0309494 A1 | 10/2017 | Osterheld et al. | |
| 2020/0086452 A1* | 3/2020 | Bajaj | B24B 57/02 |

FOREIGN PATENT DOCUMENTS

| | | |
|---|---|---|
| JP | 2000-176829 | 6/2000 |
| JP | 2000-308957 | 11/2000 |
| JP | 2004-511109 | 4/2004 |
| JP | 2006-261261 | 9/2006 |
| JP | 2012-076220 | 4/2012 |
| KR | 10-2007-0098321 | 10/2007 |
| TW | 513336 | 12/2002 |
| TW | 200503875 A | 2/2005 |
| TW | 20061 3092 A | 5/2006 |
| WO | WO 2010005702 | 1/2010 |

OTHER PUBLICATIONS

International Preliminary Report on Patentability of International Application No. PCT/US2013/078313 dated Jul. 23, 2015.
International Search Report and Written Opinion of International Application No. PCT/US2013/078313, dated Apr. 30, 2014.
Japanese Office Action of Japanese Application No. 2015-552659, dated Sep. 11, 2018.
Taiwan Search Report of Taiwan Application No. 103100864,dated Mar. 23, 2017.
KR Office Action in Korean Application No. 10-2015-7021723, dated Mar. 20, 2020, 10 pages (with English Translation).
KR Notice of Allowance in KR Application No. 10-2015-7021723, dated Jun. 8, 2020, 3 pages.
KR Office Action in Korean Application No. 10-2020-7025244, dated Sep. 17, 2020, 9 pages (with English Translation).
Taiwan Office action in Taiwan Application No. 106126405,dated Oct. 8, 2019, 8 pages (with English search report).

* cited by examiner

CHEMICAL MECHANICAL POLISHING APPARATUS AND METHODS

RELATED APPLICATIONS

This application is a continuation of U.S. patent application Ser. No. 15/635,770, filed Jun. 28, 2017, which is a divisional of U.S. patent application Ser. No. 14/143,276 filed Dec. 30, 2013, which claims priority to U.S. Provisional Patent Application Ser. No. 61/751,688, filed Jan. 11, 2013.

TECHNICAL FIELD

The present invention relates generally to semiconductor device manufacturing, and more particularly to methods and apparatus adapted to polish a substrate surface.

BACKGROUND

Within semiconductor substrate manufacturing, a chemical mechanical polishing (CMP) process may be used to remove various layers, such as silicon, oxides, copper, or the like. Such polishing (e.g., planarization) may be accomplished by pressing a rotating substrate held in a holder (e.g., polishing head or carrier) against a rotating polishing pad while a slurry is applied ahead of the substrate (e.g., patterned wafer). The slurry is commonly made up of a mixture of oxidants, metal oxide abrasive particles, etchants, complexing agents, and corrosion inhibitors. Thus, during polishing, a continuous process of oxidation by oxidants and material removal by abrasive particles and etchants is carried out by the slurry and polishing process. During this polishing process, precise control of the amount of material removal from the substrate is sought. However, given the limitations of existing processes, it is difficult to achieve uniformity, especially for removal of small layer thicknesses.

Accordingly, improved polishing apparatus, systems, and methods are sought.

SUMMARY

In a first aspect, a substrate polishing apparatus is provided. The substrate polishing apparatus includes a polishing platform having two or more zones, each zone adapted to contain a different slurry component.

In another aspect, a substrate polishing system is provided. The substrate polishing system includes a substrate holder adapted to hold a substrate, and a polishing platform having a moveable polishing pad with two or more zones, each zone operable to receive a different slurry component.

In yet another aspect, a method of processing a substrate is provided. The method includes providing a substrate in a substrate holder, providing a polishing platform having a moveable polishing pad, and dispensing a different slurry component into two or more zones on the polishing pad.

In another aspect, a substrate polishing system is provided. The substrate polishing system includes a substrate holder adapted to hold a substrate, a polishing platform having a polishing pad moveable relative to the substrate, and a distribution system adapted to dispense, in a timed sequence, at least two different slurry components selected from a group consisting of an oxidation slurry component, a material removal slurry component, and a corrosion inhibiting slurry component.

In yet another aspect, a method of processing a substrate is provided. The method includes providing a substrate in a substrate holder, providing a polishing platform having a moveable polishing pad, and dispensing between the polishing pad and the substrate, in a timed sequence, two or more slurry components each having a different chemical composition.

Other features and aspects of the present invention will become more fully apparent from the following detailed description of example embodiments, the appended claims, and the accompanying drawings.

DETAILED DESCRIPTION

Figure 1A:
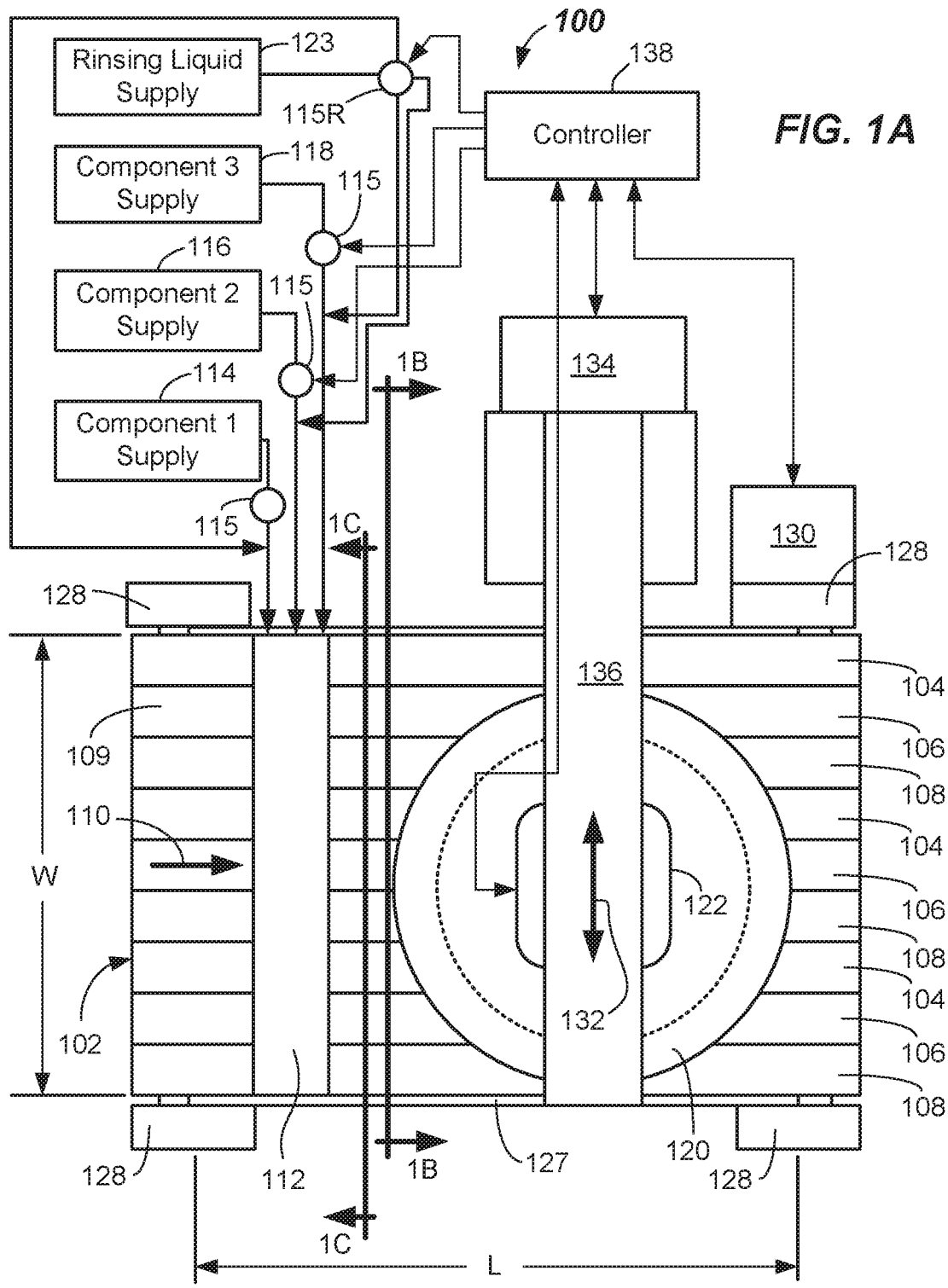
FIG. 1A illustrates a schematic top view of a linear substrate polishing apparatus according to embodiments.

Embodiments described herein relate to apparatus, systems and methods useful for, and adapted to, polishing a surface of a substrate in semiconductor device manufacturing.

Prior systems have utilized a slurry of mixed slurry components. The components of the slurry are adapted to accomplish various processes on the substrate, such as the process of oxidation of the substrate surface by oxidants and material removal by abrasive particles and etchants. In a typical small removal process adapted to remove less than about 250 Angstroms, the across the wafer removal variations may be as high as 50%-100% of the film thickness that is removed. With advancing technology, thinner and thinner films are being applied and may be undergo polishing. For example, films used in the formation of front end structures, such as inlaid metal gates and the like are very thin. As these films are provided in the device structures, it is desired that these thin films be removed with a relatively high degree of uniformity and control. Accordingly, as films get thinner, less material removal is accomplished by the CMP, and more precision is desired in the removal process. In the extreme case of atomic layer deposition (ALD), where film thickness is measured in atomic layers (e.g., Angstroms), the material removal precision is also desired to be on the order of an atomic layer.

Therefore, there is a need for a polishing apparatus and methods that enables removal of thin films, wherein such removal is accomplished with very high uniformity. Furthermore, it is desired that the method can offer precise control of the removal process, i.e. the relative amount of removal. In one aspect, embodiments of the invention physically separate the slurry components. This may be used to provide more precise control over amount of material removal. By physically (e.g., spatially) separating the slurry components, the polishing process may be provided with distinct breaks (e.g., formed as physical zones of slurry components having differing chemical composition) between two or more of the slurry components (e.g., accomplishing oxidation, material removal, and corrosion inhibition).

For example, in one or more embodiments, a polishing platform (e.g., comprising a pad support and pad) may be separated to have two or more zones, wherein each zone is adapted to contain a different slurry component. Each slurry component may have a different chemical composition. During polishing, the substrate may be moved rastered (e.g., translated) across the zones wherein each adjacent zone includes a different slurry component. Running one cycle across the zones, in sequence, may be used to effectively remove one atomic layer, for example. Total material removal can be precisely controlled by managing the number of cycles. Removal may be controlled on an atomic level.

In one or more embodiments, the polishing surface is separated (e.g., broken up) into multiple zones, wherein each zone contains an individual slurry component that performs one of an oxidation, material removal, or corrosion inhibition process. By rastering (e.g., scanning) across these separated zones, high cycle counts can be achieved within reasonable total polish time. For example, within an oxidation zone containing the oxidation slurry component, oxidants function to oxidize the surface layer of substrate. This oxidation process may be self-limiting, since only a surface layer is exposed to oxidants. Within the material removal zone containing, for example, the removal and etchant slurry component, abrasives and etchants attack the previously-oxidized surface layer. The material removal zone may be adjacent to the oxidation zone. This material removal process may also be self-limiting, since only the oxidized layer is removed. A corrosion inhibiting zone containing a corrosion inhibiting slurry component (e.g., including corrosion inhibiters) operates on the previously abraded surface layer to limit corrosion thereof. The corrosion inhibiting zone may be provided adjacent to the oxidation zone.

In another aspect, rather than being separated physically, the application of the slurry components are separated in time. Thus, in one aspect, embodiments of the invention disclose a polishing process (e.g., a film removal process), which utilizes multi-step reactions to affect uniform film removal. In particular, embodiments of the invention separate the slurry components in time by introducing them separately and in a timed sequence. This may be used to provide more precise control over amount of material removal. This multi-step polishing process can be applied to any application where the CM' involves competing reactions.

Thus, in this aspect, the polishing process will have distinct breaks (e.g., separations in time) between administering of the various slurry components used to accomplish oxidation, material removal, and/or corrosion inhibition processes. In one or more embodiments, the oxidation slurry component may be first introduced in time, followed by a material removal slurry component (e.g., containing abrasives and/or etchants). This may be followed in sequence by introducing a corrosion inhibitor slurry component in some embodiments. The sequence may be followed by introduction of a rinsing liquid (e.g., de-ionized (DI) water) in some embodiments. In other embodiments, the rinsing liquid may be introduced between the various slurry introductions phases. These slurry components may be administered between the substrate and the polishing pad during the polishing process, as will be further explained herein.

These and other aspects of embodiments of the invention are described below with reference to FIGS. 1A-7 herein.

Figure 1B:
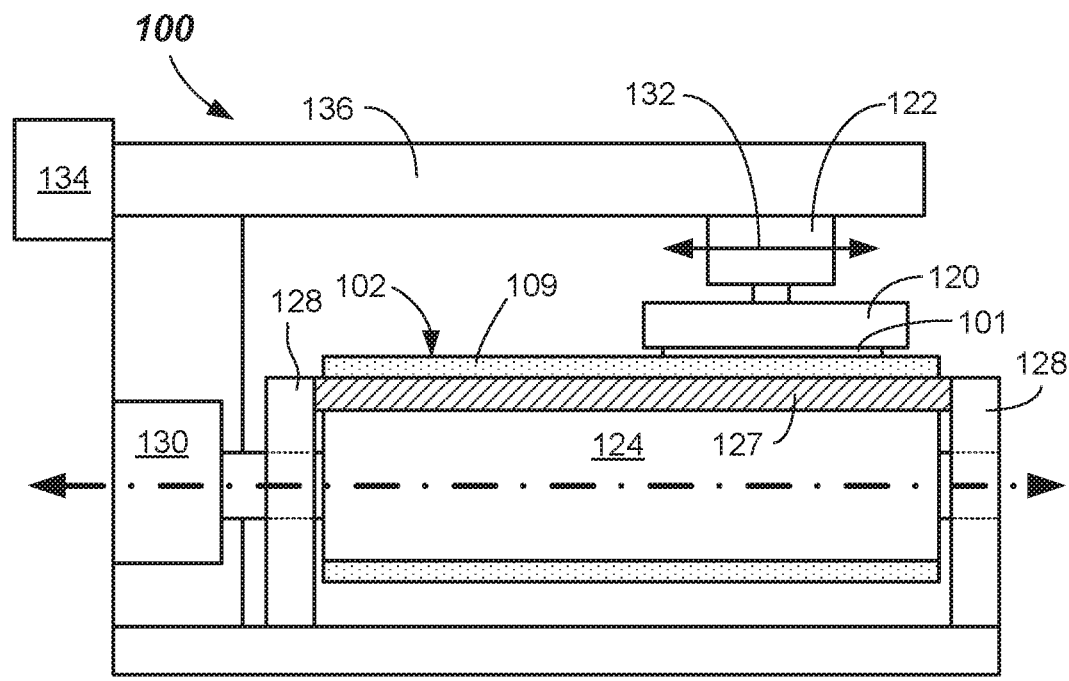
FIG. 1B illustrates a schematic cross-sectioned side view of a linear substrate polishing apparatus according to embodiments taken along section line 1B-1B of FIG. 1A.
Figure 1C:
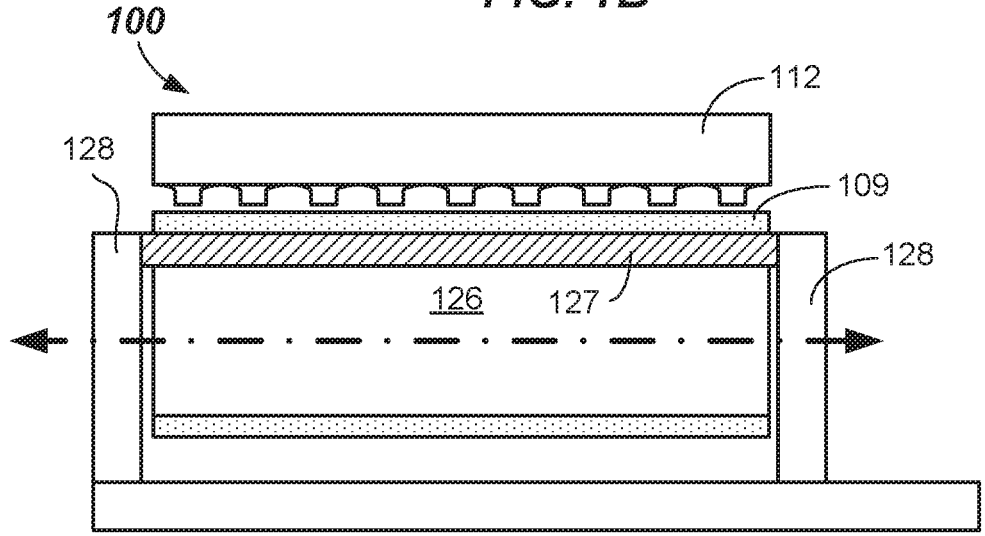
FIG. 1C illustrates a schematic cross-sectioned side view of a linear substrate polishing apparatus according to embodiments taken along section line 1C-1C of FIG. 1A.

FIGS. 1A-1C illustrate various views of a substrate polishing apparatus 100 and components thereof. The substrate polishing apparatus 100 is adapted to hold and polish a substrate 101 as will be apparent from the following description. The substrate polishing apparatus 100 includes a polishing platform 102 having two or more physical zones, such as first zone 104, second zone 106, and third zone 108. The two or more zones (e.g., 104, 106, and 108) are adapted to contain a different slurry component having a different chemistry (chemical composition). The two or more zones may be arranged across a width "W" of the platform 102. In the depicted embodiment, nine zones are shown. However, more or less numbers of zones may be provided. There may be multiple zones that are non-adjacent, but that contain a slurry component having the same chemistry. In the depicted embodiment, the platform 102 comprises a linear polishing platform wherein the two or more zones are arranged across a width "W" of a pad 109 and that extend along the length "L" of the pad with the length L being substantially longer than the width W. In the depicted embodiment, the pad 109 of the platform 102 moves linearly as indicated by directional arrow 110.

During the polishing method, various slurry components, such as slurry component 1, slurry component 2, and slurry component 3 may be applied to the pad 109 by a distributor 112. The distributor 112 may have any suitable internal structure capable of dispensing the slurry components to the two or more zones (e.g., to zones 104, 106, 108). The slurry component 1, slurry component 2, and slurry component 3, for example, may be received from slurry component supplies 114, 116, 118, respectively. More or less numbers of slurry components may be provided. The supply of slurry components to the distributor 112 may be accomplished by a distribution system having one or more suitable pumps or other flow control mechanisms 115. "Slurry component" as used herein means a processing medium that is adapted to carry out one or more designated polishing functions. In some embodiments, a rinsing liquid (e.g., de-ionized water) may be provided from the rinsing liquid source 123 and inserted between two or more of the zones, such as between zone 104 and 106, or between 106 and 108, or between both zones 104 and 106 and zones 106 and 108. Any suitable construction of the distributor 112 may be used to accomplish this separation of the zones 104, 106, 108 by a rinsing liquid zone.

For example, slurry component 1 may comprise a material adapted to execute a surface modification function, such as oxidation or other surface modification such as the formation of a nitride, bromide, chloride, or hydroxide containing later. Slurry component 1 may contain a liquid carrier such as purified water, and an oxidant such as hydrogen peroxide, ammonium persulfate, or potassium iodate. Other surface modifying materials may be used. Slurry component 1 may be supplied to the first zone 104 of the pad 109 from the component supply 1 114 through a first channel 119A (FIG. 3G) of the distributor 112, for example.

Slurry component 2 may comprise a material adapted to execute a material removal function. Slurry component 2 may contain a liquid carrier such as purified water, and abrasive media such as silicon dioxide or aluminum oxide. The abrasive may have an average particle size between about 20 nanometers and 0.5 microns. Other particle sizes may be used. Slurry component 2 may also include an etchant material such as carboxylic acid, or an amino acid. Other etchant or complexing agent materials may be used. Slurry component 2 may be supplied from the component supply 2 116 to the second zone 106 of the pad 109 by a second channel 119B (FIG. 3F) of the distributor 112, for example.

In one or more embodiments, slurry component 3 may comprise a material adapted to execute a corrosion inhibition function. Slurry component 3 may contain a liquid carrier such as purified water, and corrosion inhibitor such as benzotriazole, or 1,2,4 Triazole. Slurry component 3 may be supplied from the component supply 3 118 to the third zone 108 of the pad 109 by a third channel 119C (FIG. 3E) of the distributor 112, for example.

The zones 104, 106, 108 may be arranged in a side by side fashion and may each have a width of between about 2 mm and 50 mm. The widths may be the same as or different from each other. Other widths may be used.

In one or more embodiments, a distribution system including a distributor 112 is adapted to dispense into the two or more zones (e.g., zone 104, 106) at least two different slurry components. The slurry components may be selected from a group consisting of a surface modification slurry component, and a material removal slurry component, as discussed above.

In one or more embodiments, the distributor 112 may be formed as a unitary component and may be positioned adjacent to the pad 109 (e.g., just above the pad 109). The distributor 112 may provide delivery of the slurry components concurrently through two or more outlets (e.g., through outlets 121A, 121B, and 121C). For example, as shown in FIG. 3A-3G, the distributor 112 may be part of a distribution system that may include multiple channels, such as a first channel 119A extending along a length of the distributor body 117. First channel 119A is adapted to distribute the slurry component 1 from component 1 supply 114 to one or more first distribution outlets 121A that are fluidly coupled to the first channel 119A along its length.

The distributor 112 may also include a second channel 119B extending along the length of the distributor body 117 and adapted to distribute the slurry component 2 from component 2 supply 116 to one or more second distribution outlets 121B that are fluidly coupled to the second channel 119B along its length.

The distributor 112 may also include a third channel 119C extending along the length of the distributor body 117 and adapted to distribute the slurry component 3 from component 3 supply 118 to one or more second distribution outlets 121C that are fluidly coupled to the third channel 119C along its length. Other channels and interconnected outlets may be provided to disburse other slurry components and/or a rinsing liquid.

In some embodiments, the rinsing liquid may be received in a separate separation zone to separate the disbursed slurry components. The outlets 121A, 121B, 121C may have a diameter of less than about 5 mm, or between about 1 mm and 15 mm in some embodiments. A pitch (e.g., spacing between the adjacent outlets) may be less than about 50 mm, less than about 25 mm, or even less than about 10 mm in some embodiments. In some embodiments, the pitch may be between about 2 mm and 50 mm. Other diameters and pitches may be used.

In other embodiments, the distributor may be comprised of separate distributor heads, one for each slurry component that may be arranged at different spatial locations on the pad 109. A rinsing liquid (e.g., DI water) may be delivered through some or all of the outlets 121A-121C, or through separate outlets specifically designed for the rinsing liquid. Rinsing liquid may be provided from rinsing liquid supply 123 to some or all of each of the outlets 121A-121C by controlling valve 119S. Optionally, the rinsing liquid may be provided by a separate distributor head or separate outlets from the distributor 112.

In another embodiment, the distributor may be included in the pad support 127 of the platform 102. In this embodiment, the slurry components 1, 2, 3 may be disbursed to the various zones 104, 106, and 108 from underneath the pad 109. The pad support 127 may include holes like the outlets 121A-121C in distributor 112 being arranged across the width of the pad 109. Each hole may be fluidly coupled to one of the slurry component supplies 114, 116, 118. The various separated slurry components 1, 2, 3 may pass though the holes and wick through the pad 109 containing an internal porous structure of connected open pores as the pad 109 is rotated on the rollers 124, 126. The wicking provides the slurry components 1, 2, 3 to the one or more zones 104, 106, 108, respectively. Rinsing liquid may also be disbursed through some or all of the holes.

Again referring to FIGS. 1A-1C, as the slurry components are being supplied to the zones 104, 106, 108 of the pad 109, a substrate holder 120 of the substrate polishing apparatus 100 may be rotated. Substrate holder 120 is adapted to hold the substrate 101 in contact with the pad 109 and rotate the substrate 101 as the polishing takes place. Other motions may be provided in addition or in place of the rotation, such as orbital motion. Rotational speed may be between about 10-150 RPM, for example. Rotation may be accomplished by driving the holder 120 with a holder motor 122. Any suitable motor may be used. An applied pressure on the substrate 101 during polishing may be between about 0.1 psi and 1 psi, for example. Any suitable conventional mechanism for applying the pressure may be used, such as a spring-loaded mechanism or other suitable vertically-acting actuator. Other rotational speeds and pressures may be used. Substrate holders (also referred to as retainers or carrier heads) are described in U.S. Pat. Nos. 8,298,047; 8,088,299; 7,883,397; and 7,459,057, issued to the present assignee, for example.

As the slurry components 1, 2, 3 are applied to the respective zones 104, 106, 108, the pad 109 may be moved in the direction of the arrow 110. The linear speed of movement of the pad 109 in the direction of arrow 110 may be between about 40 cm/sec and about 600 cm/sec, for example. Other speeds may be used. The pad 109, as best shown in FIGS. 1B and 1C, may be provided in the form of a continuous or endless belt. The pad 109 may be supported at its ends by first and second rollers 124, 126 (e.g., cylindrical rollers) and underneath the top portion of the pad 109 by a pad support 127 spanning the width of the pad 109.

Rollers 124, 126 may be supported for rotation on a frame 128 by bearings or bushings, or other suitable low friction devices, for example. One of the rollers, such as roller 126, may be coupled to a pad drive motor 130 which may be driven at the appropriate rotational speed to accomplish the linear polishing speed of the pad 109 described above. Pad support 127 may also be coupled to the frame 128 at one or more locations and may support the upper portion of the pad 109 underneath some or most of the length L of upper surface of the pad 109.

In addition to the rotation of the substrate holder 120, and the motion of the pad 109, the holder 120 may be translated in the direction of directional arrow 132. The translation may be an oscillation back and forth along the transverse direction 132, generally perpendicular to the linear motion of the pad 109. Translation may be caused by any suitable translation motor 134 and drive system (not shown) that moves the substrate holder 120 back and forth along a support beam 136. The drive system adapted to accomplish the translation may be a rack and pinion, chain and sprocket, belt and pulley, drive and ball screw, or other suitable drive mechanism. In other embodiments, an orbital motion may be provided by a suitable mechanism. The rotation of the pad 109, rotation and translation (e.g., oscillation) of the substrate holder 120, and the distribution flow of the slurry components 1, 2 and 3 and rinsing liquid 123 may be controlled by controller 138. Controller 138 may be any suitable computer and connected drive and/or feedback components adapted to control such motions and functions.

The pad 109 may be made of a suitable polishing pad material, for example. The pad 109 may be a polymer material, such as polyurethane, and may have open surface porosity. Surface porosity may be open porosity and may have an average pore size of between about 2 microns and 100 microns, for example. Pad may have a length L, as measured between the centers of the rollers 124, 126, of between about 30 cm and 300 cm, for example. Other dimensions may be used.

Figure 2A:
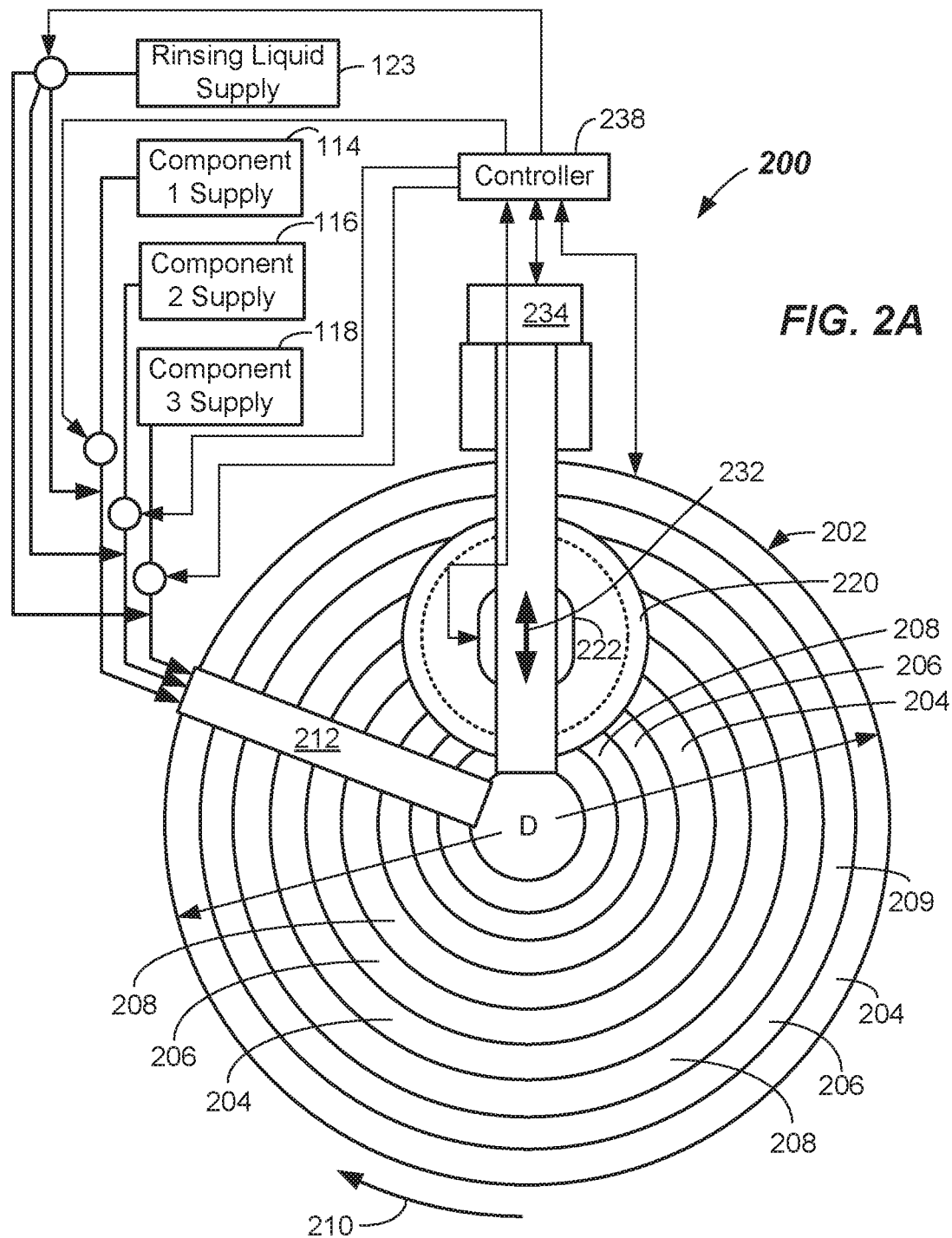
FIG. 2A illustrates a schematic top view of a rotary substrate polishing apparatus according to embodiments.
Figure 2B:
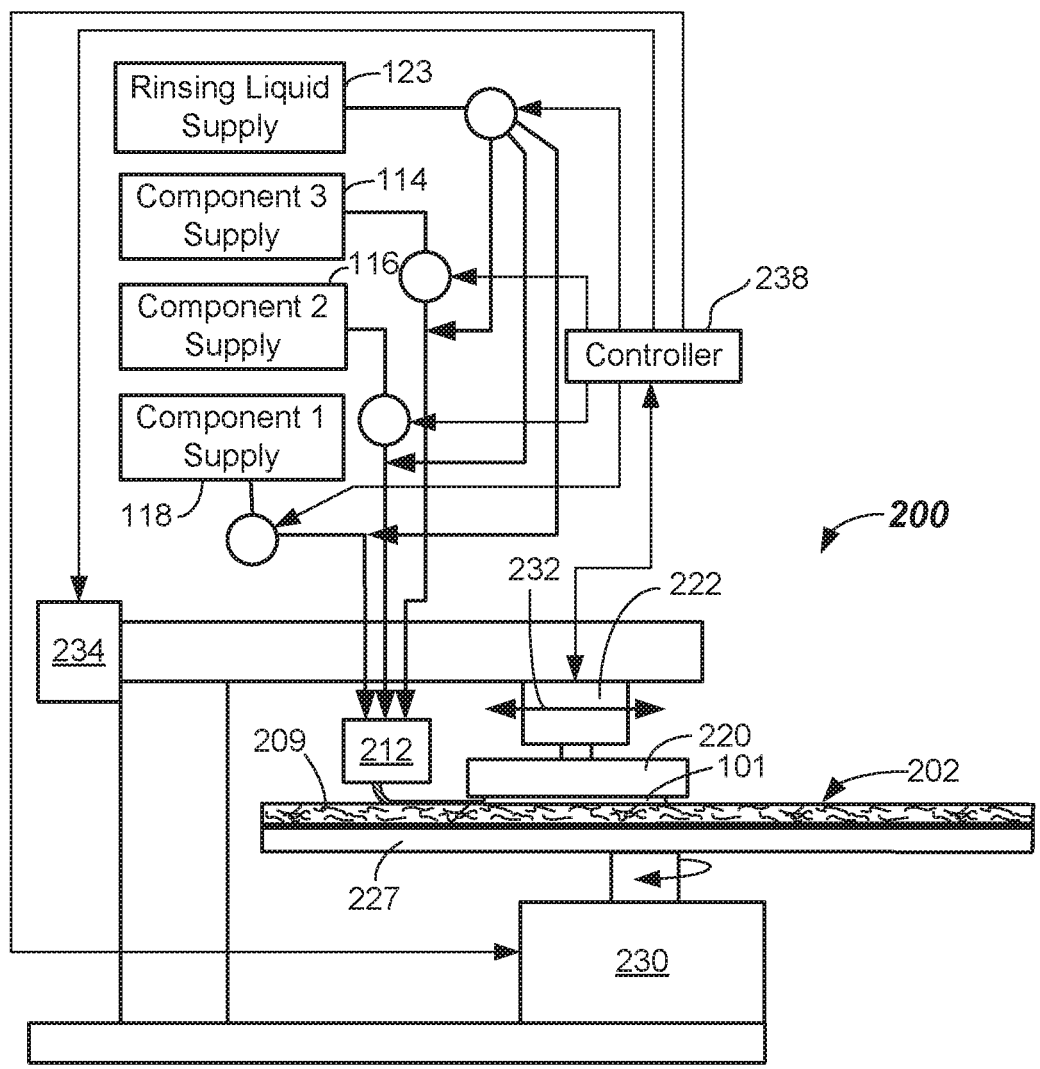
FIG. 2B illustrates a schematic side view of a rotary substrate polishing apparatus according to embodiments.
Figure 3A:
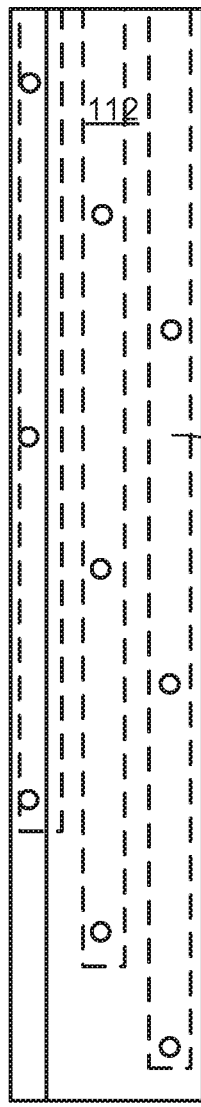
FIG. 3A illustrates a top view of a slurry distributor according to embodiments.
Figure 3C:
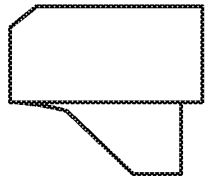
FIG. 3C illustrates a first end view of a slurry distributor according to embodiments.
Figure 3D:
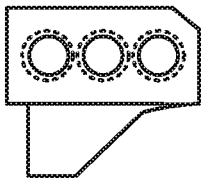
FIG. 3D illustrates a second end view of a slurry distributor according to embodiments.
Figure 3E:
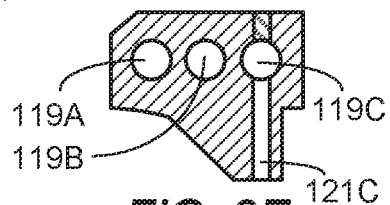
FIGS. 3E-3G illustrate various cross section view of a slurry distributor according to embodiments.
Figure 3F:
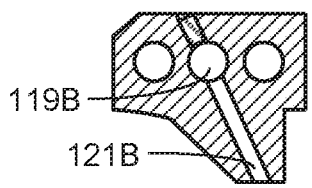
Figure 3G:
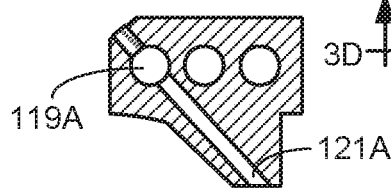
Figure 3B:
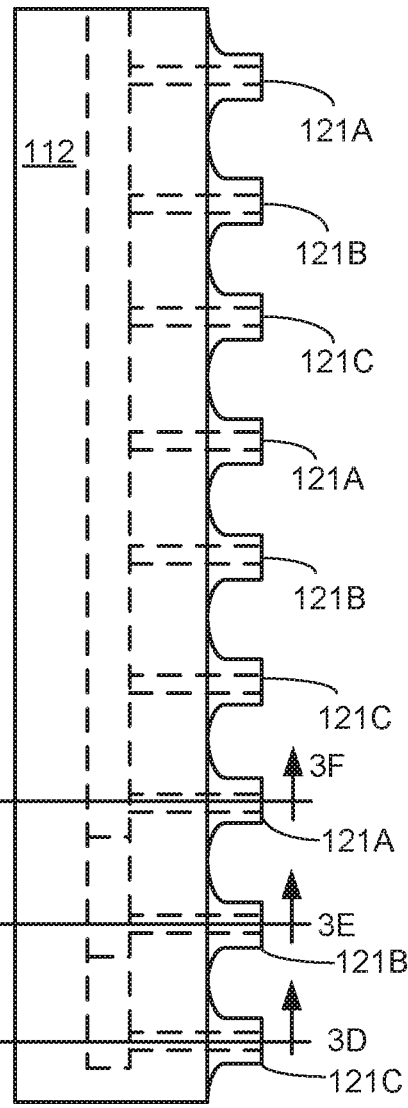
FIG. 3B illustrates a side view of a slurry distributor according to embodiments.

FIGS. 2A and 2B illustrate various views of an alternative embodiment of a substrate polishing apparatus 200 and components thereof. As before, the substrate polishing apparatus 200 is adapted to hold and polish a substrate 101 as will be apparent from the following description. The substrate polishing apparatus 200 includes a polishing platform 202 having a pad 209 and a pad support 227 (e.g., a platen). The polishing platform 202 has two or more physical zones, such as first zone 204, and second zone 206, and even a third zone 208. Zones 204, 206, 208 in this embodiment are arranged as concentric annuli, and the platform 202 is rotatable.

Each zone 204, 206, 208 is adapted to contain a different slurry component having a different chemistry, such as slurry components 1-3 described above. The slurry components may be dispensed to the various zones 204, 206, 208 by a distributor 212 coupled to the component supplies 114, 116, 118, via valves or other flow control mechanism as commended by controller 238 as described before. The two or more zones 204, 206, 208 may be arranged across a diameter "D" of the platform 202. The width of each annular zone may be the same or different and of a width, and may be as described above. In the depicted embodiment, nine annular zones are shown. However, more or less numbers of zones may be provided. Furthermore, there may be multiple zones that are not adjacent to each other, but that contain a slurry component having a same chemistry (e.g., chemical composition). For example, each of the zones labeled 204 may receive and contain the same slurry chemistry. Each of the zones labeled 206 may receive and contain the same slurry chemistry, and each of the zones labeled 208 may receive and contain the same slurry component chemistry. However, the chemistries in each of the zones 204, 206 and 208 may have different slurry component chemistries as compared to each other.

In the depicted embodiment, the platform 202 comprises a rotary polishing platform wherein the two or more zones (e.g., zones 204, 206 or 204, 206 and 208) are arranged across a diameter D the pad 209. The platform 202 and pad 209 may be rotated in the direction of directional arrow 210 at rotational speed of between about 10 and about 200 RPM by a platform motor 230. As before, the substrate holder 220 may be rotated by a suitable holder motor 222 to rotate the substrate 101 as the polishing takes place. Rotational speed of the holder 220 may be between about 10 RPM-200 RPM, for example. Similarly, the holder 220 may be translated (e.g., oscillated) back and forth along the transverse direction 232, generally perpendicular to the tangential motion of the pad 209. Translation may be caused by any suitable translation motor 234 and drive system (not shown) as described above.

An applied pressure on the substrate 101 during polishing may be as discussed above, for example. Any suitable conventional mechanism for applying the pressure may be used, such as a spring-loaded mechanism or actuator. Other rotational speeds and pressures may be used. Substrate holder 220 may be as described in U.S. Pat. Nos. 8,298,047; 8,088,299; 7,883,397; and 7,459,057, for example.

Figure 4:
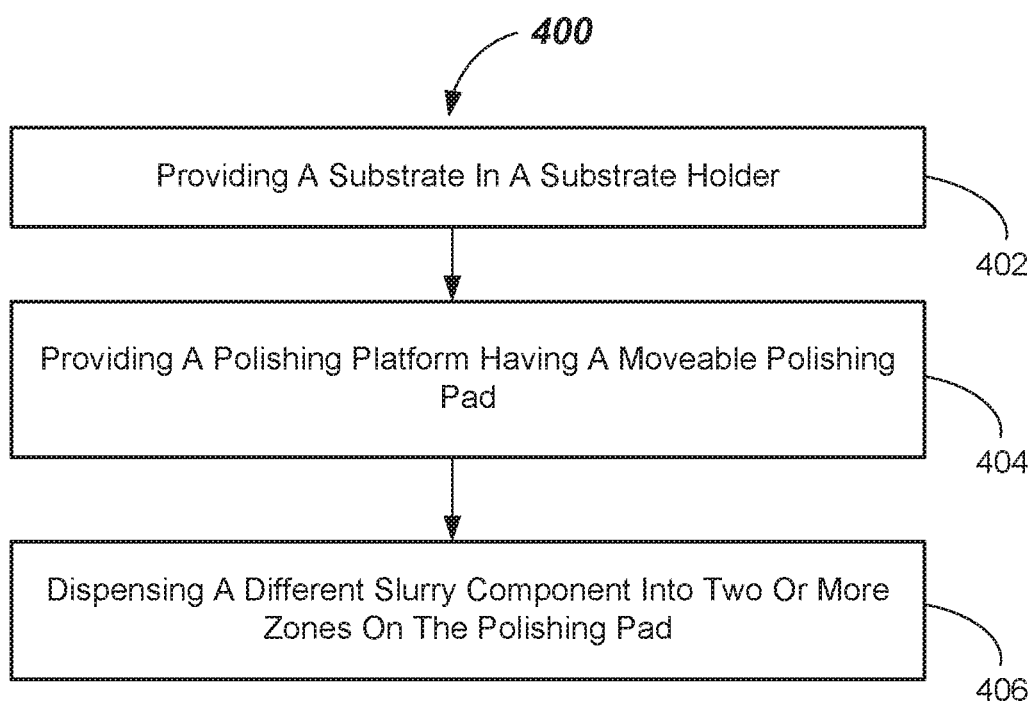
FIG. 4 illustrates a flowchart of a method of polishing a substrate according to embodiments.

FIG. 4 illustrates a method 400 of processing a substrate (e.g., substrate 101), and in particular a method of polishing a surface (e.g., a front side or backside surface) of a substrate 101 (e.g., a patterned or unpatterned wafer). The method 400 includes, in 402, providing a substrate in a substrate holder (e.g., substrate holder 120, 220), providing, in 404, a polishing platform (e.g., polishing platform 102, 202) having a moveable polishing pad (e.g., polishing pad 109, 209), and, in 406, dispensing a different slurry component into two or more zones (e.g., zones 104, 106, 108) on the polishing pad. The polishing pad may be of the linear moving version 109 or rotationally moving version 209. The slurry components may be disbursed to the zones (e.g., zones 104, 106, 108) above the pad 109 or below the pad 109 (e.g., by wicking or other capillary action).

In another aspect, a substrate polishing system is provided as described in either of FIG. 1A-1C or 2A and 2B. The substrate polishing system 100, 200 includes a polishing holder 120, 220 adapted to hold a substrate 101, a polishing platform 102, 202 having a polishing pad 109, 209 moveable relative to the substrate 101, and a distribution system adapted to dispense at least two different slurry components selected from a group consisting of an oxidation slurry component, a material removal slurry component, and a corrosion inhibiting slurry component. In this aspect, rather than being distributed into zones arranged across the width W or diameter D of the pad 109, 209, the two or more slurry components are dispensed in a timed sequence, one after another.

In accordance with this aspect, a first slurry component selected from the group consisting of an oxidation slurry component, a material removal slurry component, and a corrosion inhibiting slurry component is first dispensed onto the pad (e.g., pad 109, 209). After a predetermined amount of time has elapsed, the supply of the first slurry component is stopped, and a second slurry component selected from the group consisting of an oxidation slurry component, a material removal slurry component, and a corrosion inhibiting slurry component is then dispensed onto the pad (e.g., pad 109, 209). After another predetermined amount of time has elapsed, the supply of the second slurry component is stopped, and a third slurry component selected from the group consisting of an oxidation slurry component, a material removal slurry component, and a corrosion inhibiting slurry component may then dispensed onto the pad (e.g., pad 109, 209). After a third predetermined amount of time has elapsed, the timed sequence may start over again by again dispensing the first slurry components. The sequence may be repeated as many times as necessary to accomplish the desired results, such as a desired amount of film removal. Following the polishing sequence, the pad 109, 209 may be rinsed by supplying rinsing liquid thereto.

Figure 5:
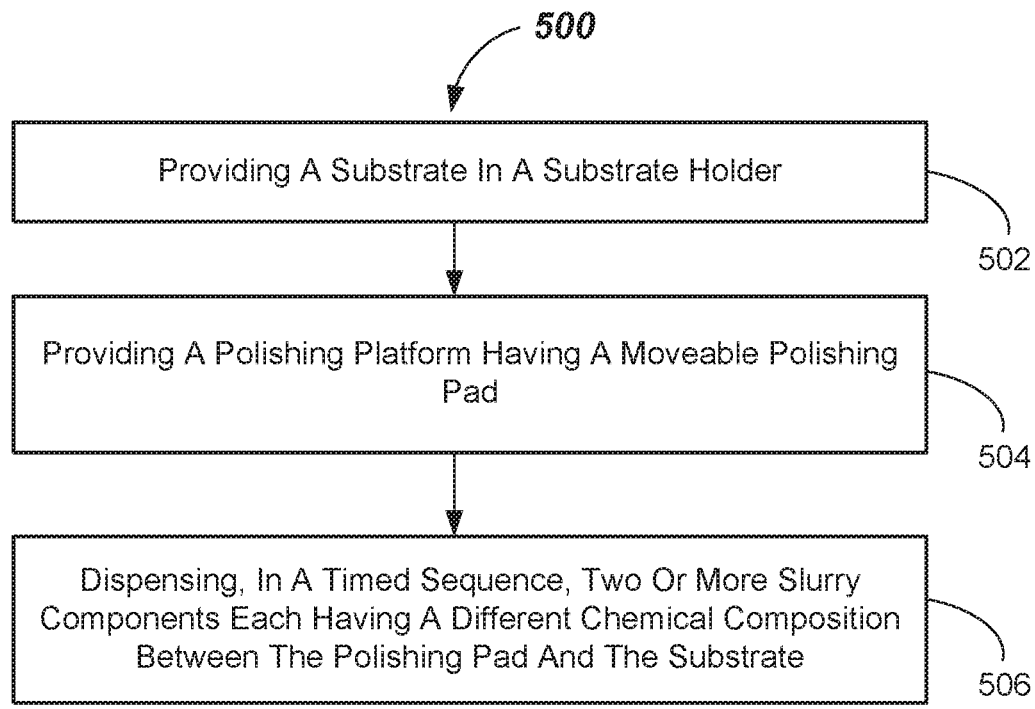
FIG. 5 illustrates a flowchart of a method of polishing a substrate according to embodiments.
Figure 6:
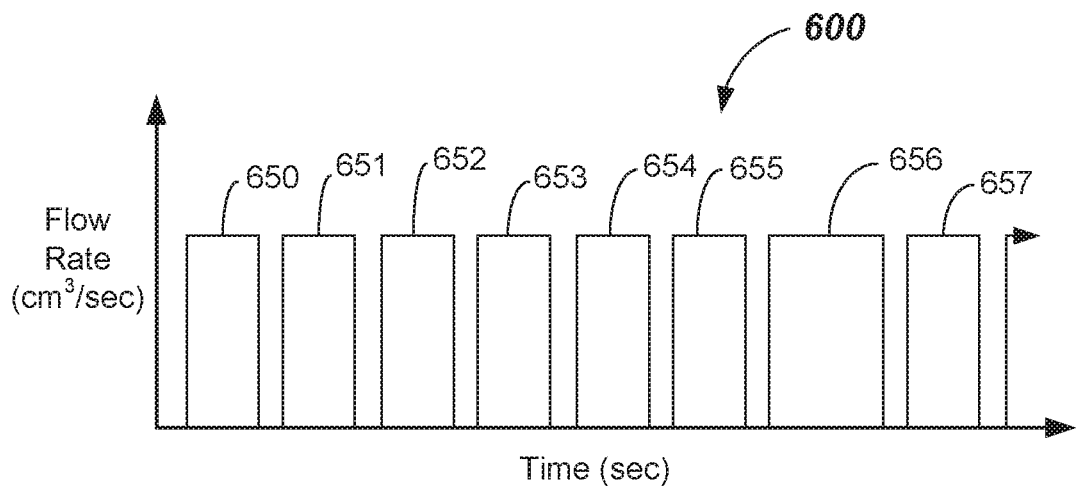
FIG. 6 illustrates a graph of phases (e.g., pulses) of a method of polishing a substrate according to embodiments.

FIGS. 5 and 6 illustrate another method 500 of polishing a substrate. The method 500 includes, in 502, providing a substrate (e.g., substrate 101) in a substrate holder (e.g., holder 120, 220), and, in 504, providing a polishing platform having a moveable polishing pad. In 506, the method includes dispensing, in a timed sequence, two or more slurry components each having a different chemical composition between the polishing pad and the substrate.

As shown in FIG. 6, the slurry components may be dispersed between the pad (e.g., pad 109, 209) and the substrate 101 in a timed sequence as shown. In a first time increment 650, a first slurry component (e.g., an oxidizing slurry component) may be supplied. This is followed by a second slurry component (e.g., a material removal slurry component) for a second time increment 651. The chemical composition of the first and second slurry components are different. This may be followed by providing a third slurry component (e.g., a corrosion inhibiting slurry component) for a third time increment 652. Two or more of these dispensing phases may be repeated in 653-655. Other phases may be performed in addition or in substitution thereof. The three- or more dispense sequences may be repeated over and over as many times are desired on a single substrate. This may be performed while the substrate is being oscillated and rotated against the moving pad (e.g., pad 109, 209) as described above. After these polishing phases are completed, the pad (e.g., pad 109, 209) may undergo a rinsing phase wherein the pad (e.g., pad 109, 209) may be supplied with a rinsing liquid (e.g., DI water or other inert liquid solution) in 656. The disbursing of the rinsing liquid (e.g., de-ionized water) may be used to dilute the last applied chemistry. The method 500 may then stop, a new substrate may be placed in the substrate holder (e.g., substrate holder 120, 220), and the described method 500 may be implemented on the second substrate starting at 657.

Each of the phases may take between about 1 second and about 60 seconds. Other time lengths may be used. Some of the pulses may be less than 1 second. Each phase may be of the same or a different length. Some of the slurry components may be combined in some embodiments to institute more than one processing phase in a single pulse. For example, an oxidation and corrosion inhibitor phase may be combined as one slurry component and provided as one pulse in some embodiments. In other embodiments, a complexing agent may be combined in a single pulse with an abrasive (e.g., a metal oxide abrasive). The oxidizing agent may be hydrogen peroxide. The corrosion inhibitor may be triazole. The complexing agent may be an organic acid, organic acid salt, or an amino acid. Other types of oxidizing agents, corrosion inhibitors, complexing agents, and abrasives may be used.

FIG. 6 illustrates another embodiment of a method 600 utilizing a series of slurry components that are disbursed in a timed sequence (e.g., as pulses of individual slurry components). The use of time-separated introduction of polishing chemistry allows for increased flexibility in use of chemical agents (e.g., two or more slurry components). For example, oxidation chemistries are generally self-limiting. A surface film may be oxidized to a depth of about 20 angstroms and then stopped. By separating the slurry components in time, more aggressive oxidation chemistries could be used where the depth of oxidation may be controlled by the length of the pulse of chemical slurry component supplied to the substrate.

In particular, individual phases may be instituted to affect specific reactions to form a modified layer on the surface of the substrate. In some conventional material removal processes, systems use slurry additives which may suppress removal at lower polishing pressures. These prior polishing systems may provide better control of within die (WID) thickness because removal rates drops dramatically once topography has been removed. As a result, topography in regions of a die with low density is quickly removed and then the dielectric removal stops while topography removal in other regions of the die continues to polish until they are planarized.

However, these systems suffer from very low removal rates (by design) once the main topography has been planarized. They may also suffer from large features being incompletely removed. A multi-step method according to an aspect of the invention having phased (e.g., timed) introduction of the slurry components (e.g., additive, abrasive without additive, and possibly interspersed and/or followed by a rinse) may be use to overcome these previous limitations. For example, the additive could be first introduced, followed by an abrasive solution which dilutes the additive and enables limited film removal. Additional removal could be accomplished by introduction of rinse which may quickly dilute the additive and allows limited removal of film until the charge of abrasive slurry component is exhausted.

Figure 7:
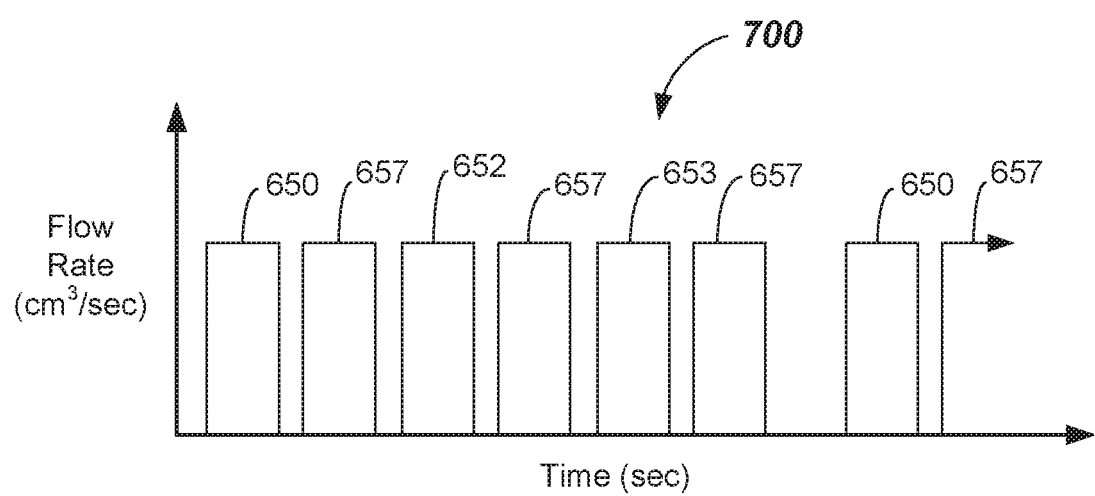
FIG. 7 illustrates a graph of phases (e.g., pulses) of another method of polishing a substrate according to embodiments.

An example of the multi-step method and system is provided below. The method may be useful for metal film removal, and may involve an oxidation phase involving film oxidation, and a phase of inhibitor adsorption and complexing agent aided abrasion of the oxidized surface, which are executed in a serial manner to achieve film removal per reaction cycle. In this embodiment, each of the slurry components may be dispersed between the pad (e.g., pad 109, 209) and the substrate 101 in a timed sequence, but with a rinsing phase being instituted between the disbursement of each slurry component, as shown in FIG. 7. Thus, each pulse of a slurry component (e.g., oxidizing, inhibitor, complexing agent, material removal agent) may be separated by a pulse of a rinsing agent (e.g., DI water) to rinse the surface of the pad (e.g., pad 109, 209) and substrate 101.

In particular, in a first time increment 650, a first slurry component (e.g., an oxidizing slurry component) may be supplied. This is followed by a rinse in 657. Then a second slurry component (e.g., a material removal slurry component) may be disbursed for a second time increment 652. This may be followed by another rinse in 657. The chemical composition of the first and second slurry components are different. This second rinse 657 may be followed by a third slurry component (e.g., a corrosion inhibiting slurry component) for a third time increment 653. This may be followed by another rinse in 657. After this sequence is completed, it may be repeated again on the same substrate 101 as many times as desired to achieve the desired material removal, or a new substrate may be inserted in the substrate holder (e.g., 120, 220) and polishing of the substrate by the method 700 may commence on the new substrate. The times may be the same or different for each phase of the polishing process.

Other steps may be used in the sequence, such as an inhibitor adsorption phase, and complexation-abrasion phase. Two or more of the phases may be combined in some embodiments. The relative duration of each phase may be determined based on reaction kinetics of that particular phase. For example, an oxidation phase may be relatively short for copper polish, while it may be relatively long for polishing ruthenium or more noble metals. The pulse duration of a corrosion inhibitor phase (including inhibitor adsorption) may also be varied in length based on the kinetics of adsorption. Likewise, a complexation-abrasion phase may be varied in length based on the kinetics thereof. In some embodiments, a pulse of an oxidizing slurry component (e.g., an oxidizing solution) may be followed by a pulse of a corrosion inhibitor slurry component (e.g., an inhibitor solution), and then followed by a pulse of a complexing slurry component (e.g., a complexing agent). These sequenced pulses may be provided while the substrate 101 is being pressed against a moving surface of the pad (e.g., pad 109, 209).

Another example of a phased instruction of the slurry components in a timed sequence is as follows. A copper film removal process is provided wherein a first pulse of combined slurry component of an oxidizer and inhibitor solution are followed by a separate pulse of a complexing agent, while the substrate (e.g., wafer) is being pressed against a moving surface of the pad (e.g., pad 109, 209) as described herein. In some embodiments, the pulse of combined slurry components of oxidizer and inhibitor solution and the separate pulse of complexing agent may be interspersed by a rinsing pulse of a rinsing liquid. Optionally, the rinse pulse may be at the end of the two-phase sequence.

In another method embodiment adapted to metal oxide film polishing and removal, a two-phase method includes a first pulse of an oxidizing slurry component that may be followed by a separate sequential pulse of a combined slurry component having a metal oxide abrasive and a complexing agent. Optionally, the complexing agent slurry component and the metal oxide abrasive slurry component may be instituted as separated phases one after the other in a three-phase polishing process. A rinsing phase may be instituted between the phases or at the end of the sequence.

One significant advantage of the time sequence introduction of slurry components is that each step or pulse may be self-limiting, which may lead to relatively more uniform removal of even small thicknesses, particularly less than 500 Angstroms, and especially less than 200 Angstroms. For example, once a surface oxidation phase of a surface (e.g., a copper surface) is completed to several atomic layers (between about 25-30 Angstroms), the oxidation rate may slow dramatically. Consequently, when the complexation-abrasion phase is next executed, film removal may be automatically limited to about 25 to 30 Angstroms, regardless of the length of the phase and film removal uniformity may be made to be relatively independent of removal rate.

In each of the described methods herein, the distribution of the slurry components may be provided by the systems and apparatus described herein. Optionally, other suitable systems adapted to carry out a timed sequence delivery of the slurry components, and possibly a rinse, may be used. Accordingly, while the present invention has been disclosed in connection with example embodiments thereof, it should be understood that other embodiments may fall within the scope of the invention, as defined by the following claims.

The invention claimed is:

1. A chemical mechanical polishing apparatus, comprising:
    a platen to support a polishing pad;
    a carrier head to hold a substrate in contact with the polishing pad;
    a first slurry component supply to provide a first slurry component including an abrasive and/or etchant without an oxidizer;
    a second slurry component supply to provide a second slurry component including an oxidizer without an abrasive and without an etchant; and
    a dispenser including a first outlet positioned at a first radial position over the polishing pad and a second outlet positioned at a different second radial position over the polishing pad, the first outlet coupled to the first slurry component supply and the second outlet coupled to the second slurry component supply such that the first outlet is configured to distribute the first slurry component that includes abrasive and/or etchant without the oxidizer to one or more first zones on the polishing pad and the second outlet is configured to distribute the second slurry component that includes the oxidizer without an abrasive and without an etchant to one or more different second zones on the polishing pad.

2. The apparatus of claim 1, wherein the first slurry component includes the abrasive without an oxidizer.

3. The apparatus of claim 1, wherein the dispenser comprises a plurality of separate distributor heads including one distributor head for each slurry component.

4. The apparatus of claim 1, comprising a third slurry component supply holding a third slurry component including a corrosion inhibitor without an oxidizer, without an etchant and without an abrasive.

5. The apparatus of claim 1, comprising a rinsing liquid source to provide a rinsing liquid, and wherein the dispenser is configured to distribute the rinsing liquid to the polishing pad.

6. The apparatus of claim 5, wherein the dispenser is configured to distribute the rinsing liquid to a different third zone on the polishing pad.

7. The apparatus of claim 6, wherein the third zone is located between the first zone and the second zone.

8. The apparatus of claim 1, comprising a controller configured to cause the dispenser to deliver the first slurry component and second slurry component concurrently to the polishing pad.

9. A chemical mechanical polishing apparatus, comprising:
    a platen to support a polishing pad;
    a carrier head to hold a substrate in contact with the polishing pad;
    a plurality of slurry component supplies to provide a plurality of different slurry components, each respective slurry component including exactly one from i) an abrasive and/or etchant, ii) an oxidizer, or iii) a corrosion inhibitor; and
    a dispenser including a plurality of outlets positioned at different radial positions over the polishing pad with each outlet coupled to a different slurry component supply of the plurality of slurry component supplies such that the plurality of outlets are configured to distribute the plurality of different slurry components to a plurality of different zones on the polishing pad with each outlet dispensing exactly one from i) an abrasive and/or etchant, ii) an oxidizer, or iii) a corrosion inhibitor.

10. The apparatus of claim 9, wherein the dispenser comprises a plurality of separate distributor heads including one distributor head for each slurry component.

11. The apparatus of claim 9, comprising a rinsing liquid source to provide a rinsing liquid, and wherein the dispenser is configured to distribute the rinsing liquid to the polishing pad.

12. The apparatus of claim 11, wherein dispenser is configured to distribute the rinsing liquid to a third zone located between the plurality of different zones.

13. The apparatus of claim 9, comprising a controller configured to cause the dispenser to deliver the plurality of different slurry components concurrently to the polishing pad.

14. The apparatus of claim 9, wherein the plurality of different slurry components includes a first slurry component and a second slurry component, wherein the dispenser is configured to distribute the first slurry component to a plurality of first zones and to distribute the second slurry component to a plurality of second zones, and wherein the plurality of first zones and plurality of second zones are arranged in an alternating pattern on a polishing surface of the polishing pad.

15. A chemical mechanical polishing apparatus, comprising:
   a platen to support a polishing pad;
   a carrier head to hold a substrate in contact with the polishing pad;
   a plurality of slurry component supplies to provide a plurality of different slurry components, each respective slurry component of the plurality of different slurry components including exactly one from i) an abrasive and/or etchant, ii) an oxidizer, or iii) a corrosion inhibitor;
   a dispenser configured to distribute the plurality of different slurry components to the polishing pad; and
   a controller configured to cause the dispenser to deliver the plurality of different slurry components to the polishing pad in a timed sequence with different slurry components delivered at different times with exactly one from i) an abrasive and/or etchant, ii) an oxidizer, or iii) a corrosion inhibitor being dispensed at a time.

16. The apparatus of claim 15, wherein the dispenser comprises a plurality of separate distributor heads including one distributor head for each slurry component.

17. The apparatus of claim 15, comprising a rinsing liquid source to provide a rinsing liquid, and wherein the dispenser is configured to distribute the rinsing liquid to the polishing pad.

18. The apparatus of claim 17, wherein the controller is configured to cause the dispenser to distribute the rinsing liquid at different times than distribution of the slurry components.

19. The apparatus of claim 18, wherein the controller is configured to cause the dispenser to distribute the rinsing liquid between distribution of each slurry component.

* * * * *